(12) United States Patent
Park et al.

(10) Patent No.: US 8,388,177 B2
(45) Date of Patent: *Mar. 5, 2013

(54) LIGHT EMITTING MODULE

(75) Inventors: Young Sam Park, Seoul (KR); Hun Joo Hahm, Gyunggi-do (KR); Hyung Suk Kim, Gyunggi-do (KR); Seong Yeon Han, Gwangju (KR); Dae Hyun Kim, Ulsan (KR); Do Hun Kim, Seoul (KR); Dae Yeon Kim, Gyunggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/363,879

(22) Filed: Feb. 1, 2012

(65) Prior Publication Data

US 2012/0127705 A1 May 24, 2012

Related U.S. Application Data

(62) Division of application No. 12/535,251, filed on Aug. 4, 2009, now Pat. No. 8,132,935.

(30) Foreign Application Priority Data

Sep. 1, 2008 (KR) .......... 10-2008-0086055
Jun. 11, 2009 (KR) .......... 10-2009-0051901

(51) Int. Cl.
*F21V 7/04* (2006.01)

(52) U.S. Cl. ........ 362/235; 362/249.02; 362/249.1; 362/249.11

(58) Field of Classification Search .......... 362/800, 362/249.02, 249.11, 249.1
See application file for complete search history.

(56) References Cited

U.S. PATENT DOCUMENTS

| 7,140,751 B2 | 11/2006 | Lin |
| 7,740,386 B2 | 6/2010 | Tsuji et al. |
| 7,819,551 B2 | 10/2010 | Ward |
| 7,887,218 B2 | 2/2011 | Wang |
| 8,132,935 B2 * | 3/2012 | Park et al. ............ 362/235 |

FOREIGN PATENT DOCUMENTS

| JP | 61-183006 U | 11/1986 |
| JP | 63-202794 A | 8/1988 |
| JP | 04-258184 A | 9/1992 |
| JP | 05-185650 A | 7/1993 |
| JP | 2002-163912 A | 6/2002 |
| JP | 2007-251120 A | 9/2007 |

OTHER PUBLICATIONS

Japanese Office Action, and English translation thereof, issued in Japanese Patent Application No. 2009-188096 dated Apr. 23, 2012.
Office Action issued Nov. 20, 2012 in co-pending Japanese Patent Application No. 2009-188096.

* cited by examiner

*Primary Examiner* — Anabel Ton
(74) *Attorney, Agent, or Firm* — McDermott Will & Emery LLP

(57) ABSTRACT

There is provided a light emitting module including: a printed circuit board; a plurality of light emitting diode chips disposed at a distance from one another on a conductive pattern formed on a top of the printed circuit board; and a connector formed on a bottom of the printed circuit board and electrically connected to the plurality of light emitting diode chips. The light emitting diode chips and the connector are optimally arranged to ensure that the light emitting module is suitably utilized as a high-density linear light source including a great number of light emitting diode chips and emits light outward with minimum loss.

9 Claims, 3 Drawing Sheets

LIGHT EMITTING MODULE

CROSS-REFERENCE TO RELATED APPLICATIONS

This application is a Divisional of U.S. application Ser. No. 12/535,251 filed on Aug. 4, 2009, now U.S. Pat. No. 8,132,935 which claims the priorities of Korean Patent Applications No. 2008-0086055 filed on Sep. 1, 2008 and No. 2009-0051901 filed on Jun. 11, 2009, in the Korean Intellectual Property Office, the disclosures of which are incorporated herein by reference.

BACKGROUND OF THE INVENTION

1. Field of the Invention

The present invention relates to a light emitting module, and more particularly, to a light emitting module suitably used as a high-density linear light source.

2. Description of the Related Art

As a light emitting module for use in a liquid crystal display (LCD), a cold cathode fluorescent lamp (CCFL) has been employed. However, the CCFL employs mercury gas, which may trigger environmental pollution. Besides, the CCFL is slow in response rate, low in color reproducibility and inappropriate for a smaller-sized and lighter-weight liquid crystal display (LCD) panel. In contrast, a light emitting diode (LED) is environment-friendly, high in response rate with several nano seconds, thus effective for a video signal stream and capable of being impulsively driven. Moreover, the LED can reproduce color by 100% and alter brightness and color temperature by adjusting light amount of red, green and blue LEDs. Also, the LED carries advantages suitable for the smaller-sized and lighter-weight LCD panel. Therefore, of late, the LED has been actively employed as a backlight source of the LCD panel.

FIG. 1 is a schematic perspective view illustrating a conventional light emitting module. Referring to FIG. 1, the conventional light emitting module includes a plurality of light emitting diode chips 12 arranged on a plurality of boards 11, respectively and a resin part 13 formed to cover each of the light emitting diode chips 12. Here, in order to serve as a linear light source, the boards 11 are arranged in a length direction, respectively and electrically connected to one another by wires. Also, the plurality of boards 11 may be accommodated in a chassis structure which is not shown. However, in the light emitting module 10, light emitted from the light emitting diode chips 12 suffers interference from the wires 14, thus degraded in light emitting efficiency. Moreover, a relatively great number of light emitting diode chips 12 are hardly mounted in a predetermined space and thus not suitably applied to TVs requiring a high-density light source.

SUMMARY OF THE INVENTION

An aspect of the present invention provides a high-density light emitting module suitably used as linear light source including a great number of light emitting diode chips and capable of emitting light outward with minimum loss.

According to an aspect of the present invention, there is provided a light emitting module including: a printed circuit board; a plurality of light emitting diode chips disposed at a distance from one another on a conductive pattern formed on a top of the printed circuit board; and a connector formed on a bottom of the printed circuit board and electrically connected to the plurality of light emitting diode chips.

The plurality of light emitting diode chips may be arranged in one direction. The printed circuit board may have a bar shape, and the plurality of light emitting diode chips may be arranged in a length direction of the printed circuit board.

The connector may be formed on at least one of two ends of the printed circuit board.

The light emitting module may further include a heat sink formed on the bottom of the printed circuit board.

The light emitting module may further include a chassis formed on the bottom of the printed circuit board, wherein the chassis may be a groove for accommodating the connector.

The light emitting module may further include a connector formed within the groove of the chassis and having a shape adapted to be coupled to the connector.

The printed circuit board may include a plurality of printed circuit boards, wherein adjacent ones of the plurality of circuit boards are not connected to each other by the connector, the plurality of circuit boards forming a linear light source.

The connector may include one of female and male connectors formed in an outward direction of the printed circuit board. The printed circuit board may include a plurality of printed circuit boards, wherein adjacent ones of the plurality of circuit boards are connected to each other by the connector, the plurality of circuit boards forming a linear light source.

The light emitting module may further include a resin part covering each of the plurality of light emitting diode chips. The resin part may have a lens shape.

According to another aspect of the present invention, there is provided a light emitting module including: a printed circuit board including a plurality of holes arranged at a distance; a heat sink formed on a bottom of the printed circuit board; a plurality of light emitting diode chips disposed in the holes of the printed circuit board, respectively to be in contact with the heat sink; and a connector formed on the bottom of the printed circuit board and electrically connected to the plurality of light emitting diode chips.

The light emitting module may further include wires electrically connecting the light emitting diode chips with conductive patterns formed on a top of the printed circuit board, respectively.

The light emitting module may further include a reflecting layer formed on an area of a surface of the heat sink which is exposed by the holes of the printed circuit board but not in contact with the plurality of light emitting diode chips.

The plurality of holes of the printed circuit board may be arranged in one direction. The printed circuit board may have a bar shape, and the plurality of holes of the printed circuit board may be arranged in a length direction of the printed circuit board.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
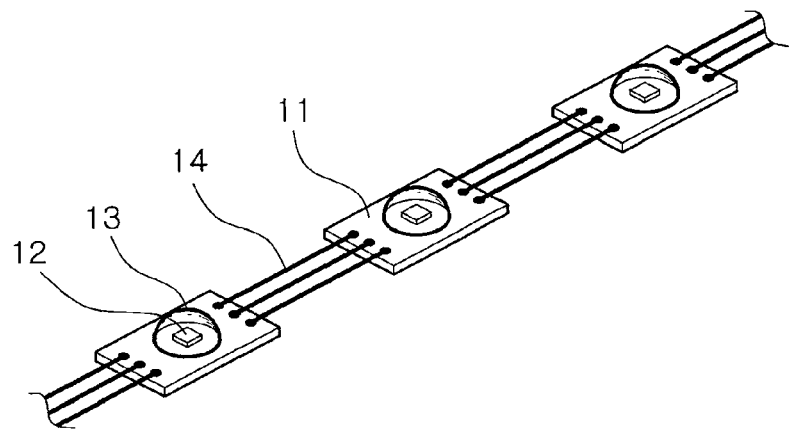
FIG. 1 is a schematic perspective view illustrating a conventional light emitting module.

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

Figure 2:
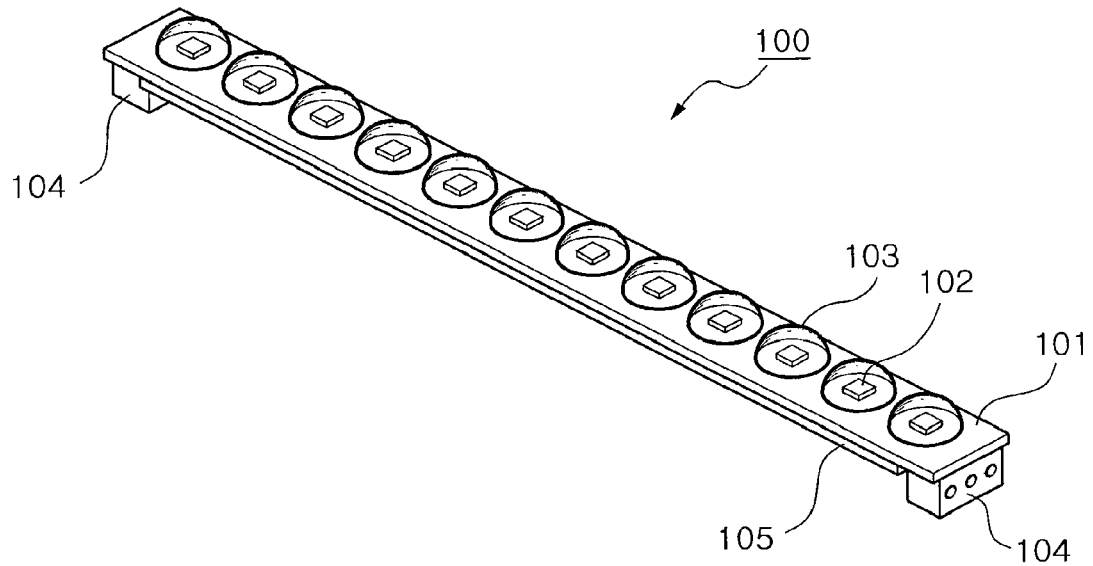
FIG. 2 is a schematic perspective view illustrating a light emitting module according to an exemplary embodiment of the invention.
Figure 3:
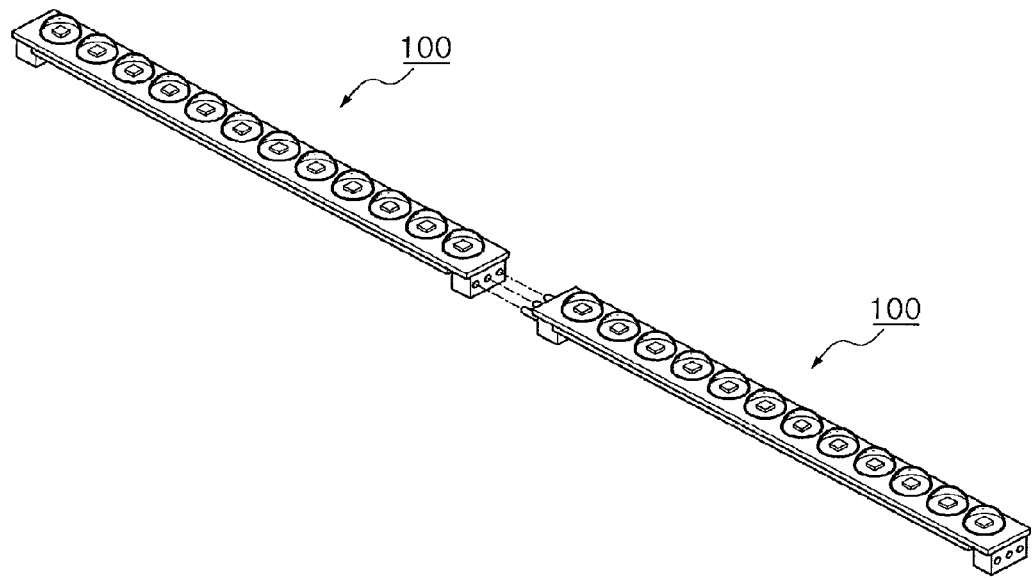
FIG. 3 illustrates a connection structure of the light emitting module shown in FIG. 2.

FIG. 2 is a schematic perspective view illustrating a light emitting module according to an exemplary embodiment of the invention. FIG. 3 illustrates a connection structure of the light emitting module shown in FIG. 2. First, referring to FIG. 2, the light emitting module 100 of the present embodiment is shaped as a bar elongated in one direction (hereinafter, length direction) and can be utilized as a linear light source. To this end, the light emitting module 100 includes a bar-shaped printed circuit board 101, and a plurality of light emitting diode (LED) chips 102 are arranged on conductive patterns of the printed circuit board 101 in a length direction of the printed circuit board 101. This is a chip on board (COB) structure in which the LED chips 102 are directly mounted on the printed circuit board 101. The printed circuit board 101 may be formed of a material such as ceramic and epoxy. Furthermore, the printed circuit board 101 may be made of polymer to maintain a bar shape stably. Particularly, unlike the conventional art, the printed circuit board 101 may have the conductive patterns formed on both a top and bottom thereof. As will be described later, a connector 104 is disposed on the conductive pattern formed on the bottom of the printed circuit board 101. This increases a greater number of LED chips 102 to be disposed and ensures light is emitted outward with minimum interference.

The resin part 103 is formed on the top of the printed circuit board 101 to cover each of the LED chips 102. The resin part 103 is made of a resin such as silicon and protects the LED chips 102. As shown in FIG. 2, when the resin part 103 has a lens shape, the light can be emitted at a greater angle of view. Also, the resin part 103 contains phosphor particles dispersed therein, thereby allowing the light emitting module 100 to emit white light.

In the present embodiment, even though not an essential element, a heat sink 105 may be disposed on the bottom of the printed circuit board 101 to effectively dissipate heat from the printed circuit board 101 and the LED chip 102. The heat sink 105 is formed by appropriately depositing a high thermal conductive material such as metal and AlN. The connector 104 is disposed on the bottom of the printed circuit board 101 to transmit an electrical signal to the LED chips and ensure connection with other light emitting module. To this end, as shown in FIG. 2, the connector 104 may be disposed on each of two ends of the printed circuit board 101 in a length direction. Moreover, the connector 104 is disposed on the conductive pattern formed on the bottom of the printed circuit board 101 to electrically connect to the LED chips 102. Therefore, the printed circuit board 101 may include a conductive via adequately.

As described above, the connector 104 may include a male or female connector for enabling the light emitting module to be connected with other adjacent light emitting module. That is, as shown in FIG. 3, the light emitting module 100 may be provided in pluralities to be connected to one another in a length direction, thereby serving as a longer linear light source. At this time, the female connector of the connector 104 and the male connector of the connector 104 of the other adjacent light emitting module may be connected together.

As described above, in the present embodiment, the printed circuit board 101 includes the conductive patterns formed on both surfaces, not one surface thereof and the connector 104 is disposed on the bottom of the printed circuit board 101. This may enable the LED chips 102 to be disposed in a greater area of the top of the printed circuit board 101. Accordingly, the light emitting module 100 can be beneficially utilized in an area requiring a high-density light source such as TV. Also, wires are not required to electrically connect the LED chips 102 with the conductive patterns of the printed circuit board 101. This allows the light emitted from the LED chips 102 to travel without interference and subsequently increases light emitting efficiency.

Figure 4:
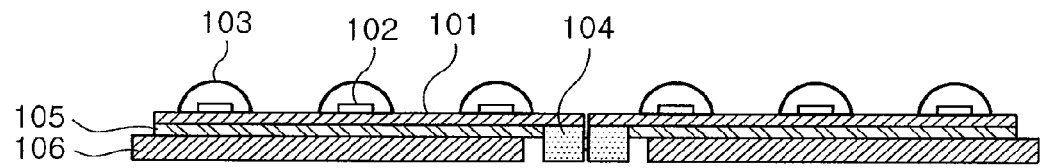
FIG. 4 is a cross-sectional view illustrating light emitting modules having a connection structure of FIG. 3 disposed on a chassis.

FIG. 4 is a cross-sectional view illustrating light emitting modules having a connection structure of FIG. 3 disposed on a chassis. Referring to FIG. 4, the light emitting module having a structure shown in FIG. 3 may be disposed on the chassis 106. Here, the chassis 106 may be formed of aluminum Al to increase heat dissipation. Notably, the chassis 106 includes a groove for accommodating the connector 104 so that the connector 104 is in close contact with the heat sink 105. Therefore, the chassis 106 can dissipate heat outward more effectively.

Figure 5:
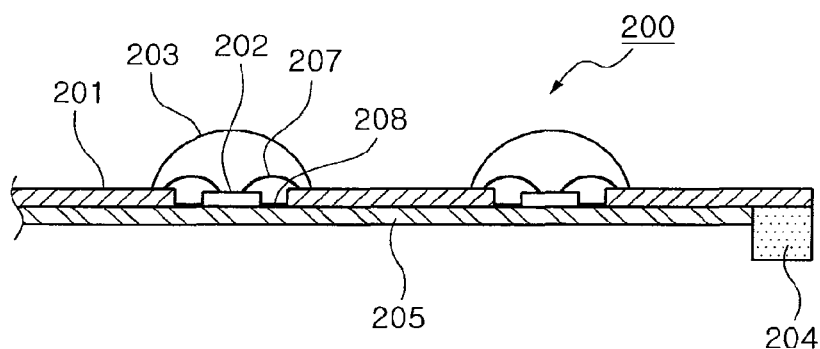
FIGS. 5 and 6 are cross-sectional views illustrating a light emitting module according to an exemplary embodiment of the invention.

FIG. 5 is a cross-sectional view illustrating a light emitting module according to an exemplary embodiment of the invention.

Referring to FIG. 5, like the previous embodiment, the light emitting module 200 of the present embodiment includes a printed circuit board 201, light emitting diode (LED) chips 202, a resin part 203, a connector 204 and a heat sink 205. Hereinafter, the light emitting module will be described based on differences from the previous embodiment. The printed circuit board 201 includes conductive patterns formed on both a top and bottom thereof and holes formed in a thickness direction thereof. The holes of the printed circuit board 201 are provided in pluralities to serve as areas for disposing the LED chips 202 therein. The holes may be arranged in a length direction of the printed circuit board 201.

The LED chips 202 are electrically connected to one another by wires without being in direct contact with the printed circuit board 201. The LED chips 202 are brought in direct contact with a top of the heat sink 205. This structure allows heat generated from the LED chip 202 to be transferred to the heat sink 205 more effectively. Meanwhile, as shown in FIG. 5, a reflecting layer 208 may be formed on the top of the heat sink 205. That is, the reflecting layer 208 is formed on an area of the top of the heat sink 205 which is exposed by the holes of the printed circuit board 201, excluding portions where the LED chips 202 are formed. The reflecting layer 208 is formed by depositing at least one of silver (Ag) and aluminum (Al). This reflecting layer 208 allows a greater amount of light to be emitted outward.

Figure 6:
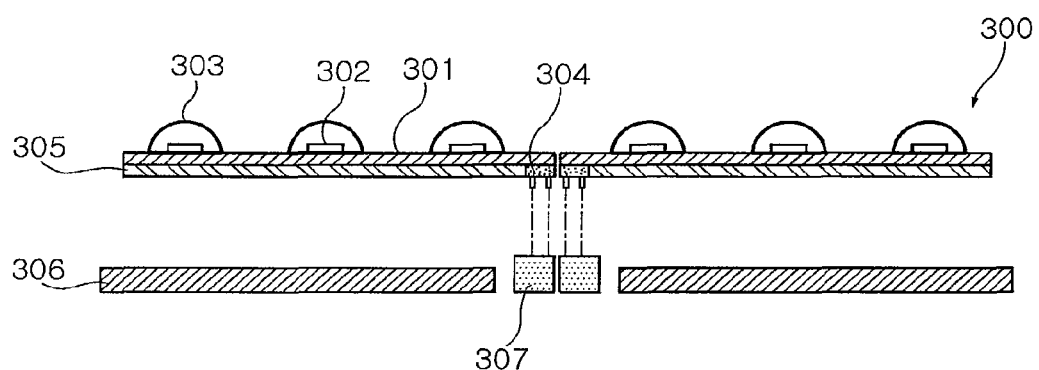

The connection method using a connector may be modified as shown in FIG. 6. FIG. 6 is a cross-sectional view illustrating a light emitting module according to an exemplary embodiment of the invention.

Referring to FIG. 6, a light emitting module 300 of the present embodiment includes a printed circuit board 301, light emitting diode chips 302, a resin part 303, a connector 304 and a heat sink 305. Here, the connector 304 is a male connector. This male connector 304 is connected to a female connector 307 that is disposed within a chassis 306, and light emitting diodes 300 are not connected to each other using connectors. Unlike the configuration, shown in FIG. 6, the connector 304, provided in the light emitting diode 300, may be a female connector, and the connector 307, provided within the chassis 307, may be a male connector. Like this embodiment, when the connector 304, provided in the light emitting module 300, is connected to the connector 307, provided within the chassis 306, the light emitting modules do not need to be first connected to each other and then assembled to the chassis, thereby reducing assembly error in the manufacturing process.

As set forth above, according to exemplary embodiments of the invention, LED chips and a connector are optimally arranged to ensure that a light emitting module is suitably employed as a high-density linear light source including the LED chips. Also, the light emitting module can emit light outward with minimum loss.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting module comprising:
   a chassis having at least one groove;
   a printed circuit board formed on the chassis;
   a plurality of light emitting diode chips disposed at a distance from one another on a conductive pattern formed on a top of the printed circuit board;
   a heat sink formed on the bottom of the printed circuit board, the heat sink being disposed between the printed circuit board and the chassis;
   a connector formed on at least one surfaces of the printed circuit board and electrically connected to the plurality of light emitting diode chips, the connector being disposed on the groove of the chassis in order that the heat sink contacts the chassis,
   wherein the connector comprises at least one of female and male connectors formed in an outward direction of the printed circuit board and
   a terminal area of the connector for a connection with an external terminal located beneath the plurality of light emitting diode chips.

2. The light emitting module of claim 1, wherein the plurality of light emitting diode chips are arranged in one direction.

3. The light emitting module of claim 2, wherein the printed circuit board has a bar shape, and the plurality of light emitting diode chips are arranged in a length direction of the printed circuit board.

4. The light emitting module of claim 1, wherein the connector is formed on at least one of two ends of the printed circuit board.

5. The light emitting module of claim 1, wherein the printed circuit comprises a plurality of printed circuit boards, wherein adjacent ones of the plurality of circuit boards are connected to each other by the connector, the plurality of circuit boards forming a linear light source.

6. The light emitting module of claim 1, further comprising a resin part covering each of the plurality of light emitting diode chips.

7. The light emitting module of claim 6, wherein the resin part has a lens shape.

8. The light emitting module of claim 1, wherein the heat sink is made of metal.

9. The light emitting module of claim 1, wherein the heat sink contact the bottom of the printed circuit board.

* * * * *